(12) United States Patent
Vázquez-Córdova et al.

(10) Patent No.: US 10,615,044 B1
(45) Date of Patent: Apr. 7, 2020

(54) MATERIAL CUTTING USING LASER PULSES

(71) Applicant: ASM TECHNOLOGY SINGAPORE PTE LTD, Singapore (SG)

(72) Inventors: Sergio Andrés Vázquez-Córdova, Apeldoorn (NL); Ruslan Rifovich Subkhangulov, Nijmegen (NL)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/163,767

(22) Filed: Oct. 18, 2018

(51) Int. Cl.
| H01L 21/00 | (2006.01) |
| H01L 21/304 | (2006.01) |
| H01L 21/67 | (2006.01) |
| B23K 26/364 | (2014.01) |
| B23K 101/40 | (2006.01) |

(52) U.S. Cl.
CPC ........ *H01L 21/3043* (2013.01); *B23K 26/364* (2015.10); *H01L 21/67092* (2013.01); *B23K 2101/40* (2018.08)

(58) Field of Classification Search
CPC .......... H01L 21/3043; H01L 21/67092; B23K 26/364; B23K 26/0624; B23K 2101/40
USPC .......................................................... 438/462
See application file for complete search history.

(56) References Cited

U.S. PATENT DOCUMENTS

2010/0246611 A1* 9/2010 Sun .................... B23K 26/0622
372/18
2016/0197015 A1* 7/2016 Lei .................... H01L 21/67207
438/462

FOREIGN PATENT DOCUMENTS

WO    WO 97/29509 A1    8/1997

* cited by examiner

*Primary Examiner* — Vu A Vu
(74) *Attorney, Agent, or Firm* — Ostrolenk Faber LLP

(57) ABSTRACT

A method of cutting a semiconductor material by irradiating the semiconductor material with laser energy, includes providing a laser source adapted to emit successive pulses of laser beams, each laser beam pulse having a pulse width of 100 picoseconds or less, emitting laser beam pulses from the laser source, guiding the emitted laser beam pulses to irradiate semiconductor material to be cut, and moving the semiconductor material relative to the irradiating laser beam pulses to cut the semiconductor material along a cutting line. The semiconductor material is irradiated by a plurality of laser beam pulses with a pulse repetition frequency in the range from 0.1 GHz to 5000 GHz.

13 Claims, 2 Drawing Sheets

MATERIAL CUTTING USING LASER PULSES

This invention relates to a method of cutting a semiconductor material and laser-cutting apparatus.

BACKGROUND AND PRIOR ART

Singulation and scribing are well-known processes in the semiconductor industry, in which a cutting machine is used to work a workpiece or substrate such as a semiconductor wafer, which could for example comprise silicon but is not so limited. Throughout this specification, the term "wafer" is used to encompass all these products. In a singulation process (also referred to as dicing, severing, cleaving for example), a wafer is completely cut through such as to singulate the wafer into individual dies. In a scribing process (also referred to as grooving, scoring, gouging or furrowing for example), a channel or groove is cut into a wafer. Other processes may be applied subsequently, for example full singulation by using a physical saw along the cut channels. Alternatively or additionally, holes may be formed in a wafer using a drilling process. Throughout the present specification, the term "cutting" will be used to encompass singulation, scribing and drilling.

However, the overall semiconductor technology trend in miniaturization is to decrease the thickness of the wafer, and as wafer thicknesses decrease, it has been shown that laser technology becomes more advantageous for singulation than the use of a mechanical saw. Exploiting high-power lasers for such material processing has significant advantages in comparison with mechanical counterparts such as, for instance, drilling and sawing, and laser processing has a great versatility in coping with small and delicate workpieces.

Laser removal of the semiconductor material occurs due to a rapid temperature increase of a relatively small area in which the laser beam is focused, which causes local material to melt, explosively boil, evaporate and ablate. Laser singulation has challenging requirements, including the delicate balance between the process throughput and the workpiece (die) quality. The quality and throughput of the process are determined by laser parameters such as fluence, pulse width, repetition rate, polarisation as well as distribution of the polarisation, wavefront shape and its phase modification and wavelength. It has been proposed to use a multiple beam laser cutting approach, for example in WO 1997/029509 A1, wherein a linear cluster of focused laser beams, which may be arranged in a linear array of laser spots, is used to ablate substrate material along a scribe-line, thus causing the substrate to be radiatively scored along the line of ablation. The use of multiple beams in this manner as opposed to a single (more powerful) beam may provide various advantages, in particular a reduction in the defect density created during the cutting process.

One of the quantitative assessments of the laser process quality is the die or wafer fracture strength, which determines a tensile stress at which the wafer breaks. Uniaxial flexure tests are commonly employed for the determination of fracture strength for brittle materials and have been adopted for wafer strength measurements. These tests include three- and four-point bending tests, which are commonly used to measure fracture strength.

It is believed that the fracture strength of the laser-separated wafers depends on the level of laser-induced defects such as micro-cracks and chip-outs, which appear after the laser singulation process in the wafer. These defects are generated by a high stress at the interface between the bulk semiconductor material and the local laser-processed area. The high stress is produced by high temperature gradients between the bulk and processed zones by acoustic shock waves emerging during the process and chemical transformations of the process side walls of the die. The region of the semiconductor material which contains such defects is commonly referred to as the "heat-affected zone". The fracture strength is typically different for the front and back sides of the wafer, and indeed there are techniques, processes and wafer layouts which can result in significantly different back-side and top-side strengths.

Recent advances in ultrashort pulse ("USP") lasers enable wafer processing to be performed more delicately, since the temporal pulse widths of those lasers are shorter than the typical times of electron-phonon relaxation in solids, which is responsible for heat transfer from photo-excited electrons to the lattice, the pulse width being less than 1-10 ps depending on the particular material being processed. USP lasers can provide an improvement to the die strength of the material, however the productivity of wafer processing systems using such USP lasers is reduced due to numerous reasons, including for example a lesser heat diffusion-induced interaction volume.

To increase the laser machining speed and hence productivity, an arrangement of laser pulses has been proposed in which there are two repetition periods or "bursts" of laser pulses emitted by a laser source, such that the time between consecutive pulses $t_1$ is shorter than the time between consecutive bursts $t_2$, i.e. the time between the first pulse $p_1$ of consecutive bursts, but longer than the laser pulse width $\Delta\tau$. The burst is an integer number n of laser pulses $p_n$ grouped within period $t_2$.

Dicing with bursts of ultrashort laser pulses at repetition frequencies (i.e. $1/t_1$) in the order of tens of MHz (from about 10,000 to about 90,000 kHz) has been shown to lead to more efficient material removal compared with a process using individual laser pulses. However, the heat load generated with pulses with these repetition frequencies induces a reduction in die strength when compared with use of a single pulse.

It has been shown that the burst mode arrangement can provide an increase in productivity. However, this increase leads to a decrease of the die strength of the singulated semiconductor dies, to such an extent that dies produced using this method may not comply with current market demands. It has been shown that the die strength substantially decreases because of an incubation effect: a cumulative effect of accumulation of damage and temperature in material.

The present invention seeks to provide an improved laser cutting method, which provides both improved wafer or die strength and also increased productivity.

In accordance with the present invention this aim is achieved by implementing a burst sequence of laser pulses, having a significantly high pulse repetition frequency.

The use of a burst mode having pulse repetition frequencies in the range of 0.1 GHz (100 MHz) to 5000 GHz (5 THz) further assists the material removal efficiency with a so-called "ablation cooling" effect, in which relatively hot material is ablated before the onset of effective heat transfer from the molten material region to the bulk by a thermal diffusion, causing the net temperature of the material to decrease, or at least not to increase substantially. It has been found that dicing of semiconductor wafers with bursts of laser pulses with pulse repetition frequencies in this range provides increases in both productivity (i.e. higher material removal efficiency) and die strength. The latter stems from two factors:

i) The energy of single pulses in each burst has to be scaled down such that the total energy of the individual pulses in the burst is equal to a certain optimum single pulse energy, so that the intensities of resulting laser-induced shock-waves, generated upon laser pulse impinging into the target, are dramatically suppressed. Shock-waves are one of the sources of defect formation and as a result reduction of die strength.

ii) Heat diffusion is suppressed by the ablation cooling mechanism, so that the size of the heat-affected zone, one of the crucial factors affecting the die strength, is decreased. In more detail, the heat load to the target is reduced by efficiently converting the energy of the train of laser pulses during the burst into material ablation, rather than creating shock waves and undesired thermal transport to the bulk of the material. This reduction in heat load in turn reduces the re-solidified laser-irradiated zone, which minimises the generation of material structural defects and crack formation.

Furthermore, such a methodology permits flexibility, for example in the use of polarization and multibeam arrangements, beam shaping as well as energy tuning of individual single pulses (burst shaping). Such flexibility allows the process to be optimally tailored for specific purposes.

The productivity of the laser dicing process and die strength of semiconductor devices are therefore increased when burst mode pulse repetition frequencies between 100 MHz and 5 THz are used, as compared with MHz and kHz burst mode pulse repetition frequencies.

SUMMARY OF THE INVENTION

In accordance with a first aspect of the present invention there is provided a method of cutting a semiconductor material by irradiating the semiconductor material with laser energy, comprising the steps of:

i) providing a laser source adapted to emit successive pulses of laser beams, ii) emitting laser beam pulses from the laser source, iii) guiding the emitted laser beam pulses to irradiate semiconductor material to be cut, and iv) moving the semiconductor material relative to the irradiating laser beam pulses to cut the semiconductor material along a cutting line, wherein the laser source is adapted to emit laser beam pulses having a pulse width of 100 picoseconds or less, and in step iii), the semiconductor material is irradiated by a plurality of laser beam pulses with a pulse repetition frequency in the range from 0.1 GHz to 5000 GHz.

Advantageously, the plurality of laser beam pulses are emitted in at least two successive bursts of pulses, each burst comprising a plurality of laser beam pulses, though this is not essential to the present invention.

In accordance with a second aspect of the present invention there is provided a laser cutting apparatus for performing the method of the first aspect.

In accordance with a third aspect of the present invention there is provided a laser cutting apparatus for cutting a semiconductor material, comprising a laser source adapted to emit successive pulses of laser beams, each laser beam pulse having a pulse width of 100 picoseconds or less, a laser beam guiding assembly for directing the laser beam pulses from the laser source to irradiate a semiconductor material to be cut, and a driving assembly for relatively moving the semiconductor material and the irradiating laser beam pulses.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

Figure 1:
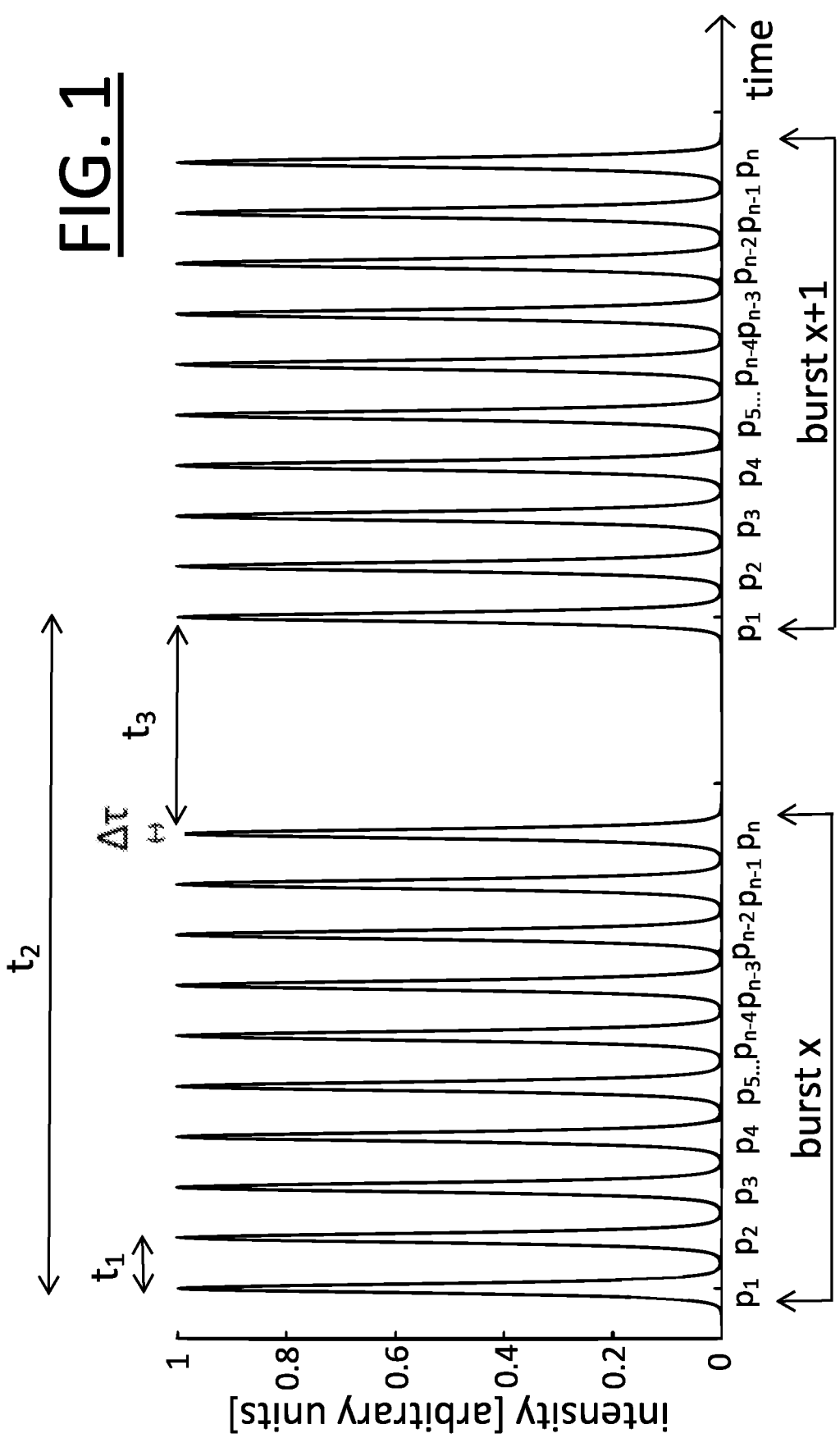
FIG. 1 schematically shows a burst laser pulse timing schedule.

The present invention will now be illustrated by referring to FIG. 1, which schematically shows an output laser beam profile, such as may be emitted by a pulsed laser source, comprising a plurality of laser beam pulses. In FIG. 1, two successive bursts, burst x and the subsequent burst x+1, are shown in a plot of intensity (y-axis) against time (x-axis). For simplicity and generality, the intensity is given in arbitrary units (a.u.).

Each of the plurality of laser beam pulses has a respective pulse energy, and, although not shown in FIG. 1, the laser source may optionally be controlled such that a pulse energy of a first laser beam pulse within the plurality has a different pulse energy to a second laser beam pulse within the plurality. As shown, there are two successive repetition periods or bursts (burst x, burst x+1) of laser beam pulses, such that the time $t_1$ between consecutive pulses is shorter than the time $t_2$ between the first pulse $p_1$ of consecutive bursts, but longer than the laser pulse width $\Delta\tau$. In accordance with the present invention, the laser beam pulse width $\Delta\tau$ is 100 picoseconds or less.

The burst is an integer number n of laser pulses $p_n$ grouped within period $t_2$. The pulse repetition or intra-burst frequency, being the frequency of laser beam pulses within a burst, is given by $1/t_1$. The inter-burst frequency, being the frequency of occurrence of the first laser beam pulse $p_1$ within successive bursts (burst x, burst x+1), is given by $1/t_2$. The final pulse $p_n$ of a first burst x is separated from the first pulse $p_1$ of the next burst x+1 by a time period $t_3$. It should be noted that if $t_3=t_1$, then bursts x, x+1 will be indistinguishable on this diagram, and there would appear to be only one uninterrupted burst. Although two bursts x, x+1 are shown in FIG. 1, the present invention may be applied using any number of bursts from a single burst up to the continuous application of bursts. As shown in FIG. 1, the pulses in each burst are of similar intensity and frequency, however as set out below, other embodiments may have different pulse or burst profiles.

In accordance with specific embodiments of the present invention:

i) The plurality of laser beam pulses in a burst have a pulse repetition frequency $1/t_1$ in the range from 100 MHz (0.1 GHz) to 5 THz (5000 GHz) and optionally from 500 MHz (0.5 GHz)-50 GHz and pulse widths $\Delta\tau$ below 100 ps;

ii) The plurality of laser beam pulses are emitted in at least one burst of pulses, preferably emitted in at least two successive bursts of pulses, each burst comprising a plurality of laser beam pulses;

iii) Each burst may comprise between 2 and 100,000 laser beam pulses (i.e. n is in the range between 2 and 100,000), optionally within the range 2 and 1000 laser beam pulses;

iv) The inter-burst frequency $1/t_2$, being the frequency of the first laser beam pulse within successive bursts, is in the range of 0.1 kHz to 1,000 kHz, optionally within the range of 1 kHz to 100 kHz;

v) The final laser beam pulse of a burst and the first laser beam pulse of the succeeding burst are separated by a time period $t_3$ in the range of 10 ms to 1 µs.

Figure 2:
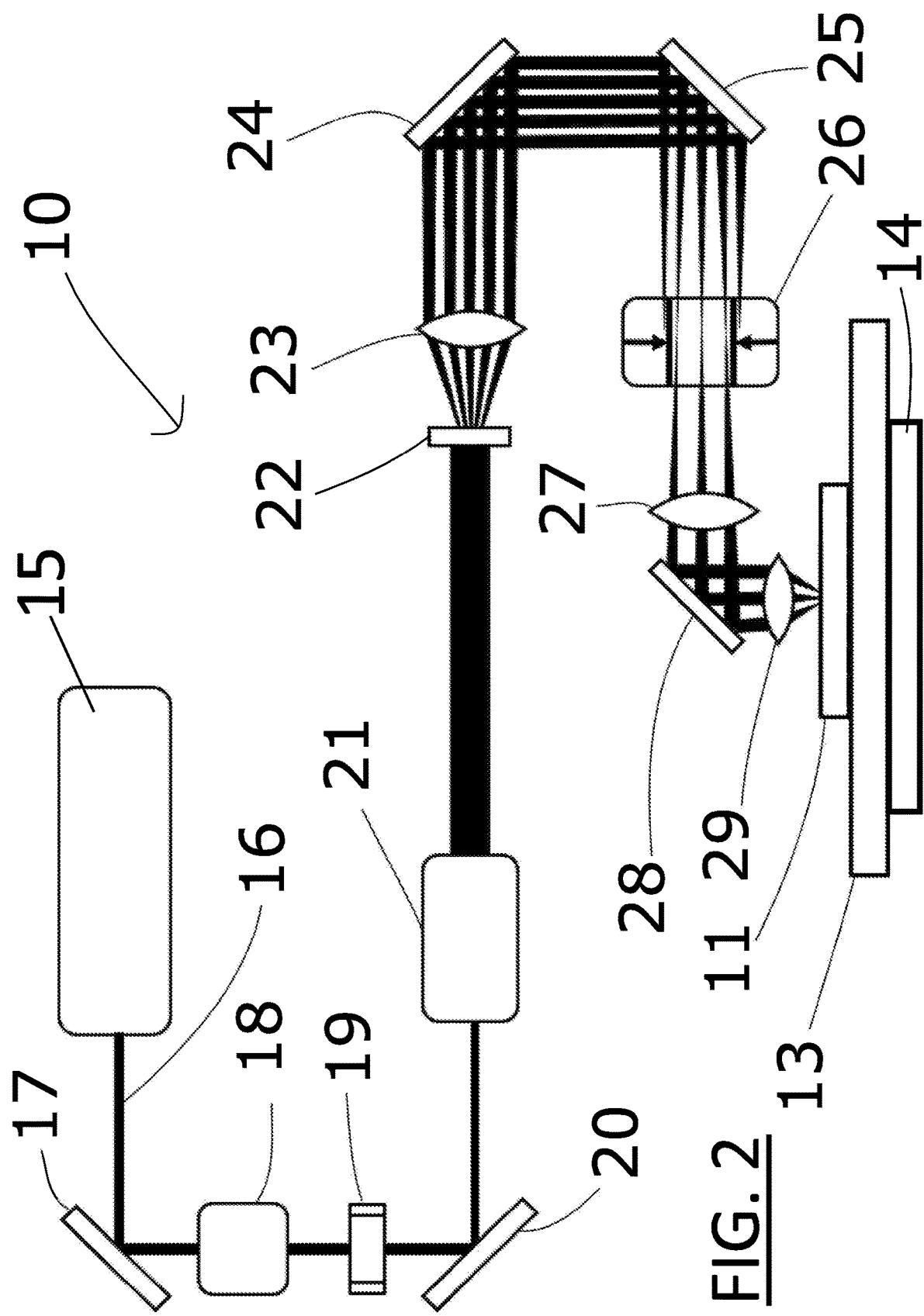
FIG. 2 schematically shows a laser cutting apparatus in accordance with an embodiment of the present invention.

A laser-cutting apparatus 10 suitable for performing the method of the present invention is schematically shown in FIG. 2.

A semiconductor material, here a semiconductor wafer 11, is supported on a chuck 13. Chuck 13, and hence wafer 11, are driven in use by a drive 14, so that there is relative movement between the wafer 11 and the irradiating laser light (see below). An ultra-short pulse laser source 15 is adapted to output pulses of polarized laser beam 16 in accordance with a timing schedule such as that described above. The laser source 15 is operative to output laser beam pulses, i.e. a pulsed laser beam 16. with pulse-widths $\Delta\tau$ of 100 picoseconds or less. The pulsed laser beam 16 is guided by an assembly to the wafer 11. In more detail, a mirror 17 guides the beam 16 an attenuator/shutter 18 for control of the beam. A selectively actuable optical polarizing component, here in the form of a motorised half-wave plate 19, is provided to be selectively movable for interaction with the pulsed laser beam 16. Preferably the half-wave plate 19 is mounted for rotation around the laser beam axis. Therefore, by selectively rotating half-wave plate 19 the polarization state of the laser beam 16 can be controlled in a switching manner. The selective movement is implemented by controlled operation of the motor by a control means (not shown) such as a computer, processor or the like. Another mirror 20 guides the pulsed laser beam 16 to a beam expander 21 to produce a widened beam. A diffractive optical element ("DOE") 22 diffracts or splits the widened beam into a predetermined pattern of spatially-separated output sub-beams, which are collimated by a lens 23. Further mirrors 24, 25 guide the sub-beams to a spatial filter 26, which is used to form a desired predetermined beam pattern. A second lens 27 directs the sub-beams onto another mirror 28, which in turn guides them to a focusing lens 29. This focuses laser light to the wafer 11 on the supporting chuck 13, in a predetermined pattern of illumination spots. By moving the wafer relative to the irradiating pulsed laser beam 16, the laser beam pulses irradiate and thus cut the wafer 11 along a cutting line (not shown).

Depending on the semiconductor material to be cut, and the type of cutting operation (such as grooving, singulation etc.), it may be advantageous to change the laser beam pulse characteristics between successive bursts. For example, by suitable control of the laser source 15, successive bursts may have different pulse repetition frequencies. Alternatively or additionally, the energy transmitted in successive bursts may be different, for example by controlling the laser source such that a pulse energy of a pulse within a first burst is different to a pulse energy of a pulse within a second or subsequent burst.

Alternatively or additionally, the polarisation of the emitted laser beam pulses may be controlled, for example by selective rotation of half-wave plate 19, such that the laser beam pulses of different bursts have different laser beam polarisation states. For example, the laser beam pulses of burst x may have linear polarisation, for example parallel or perpendicular to the cutting line, while the laser beam pulses of burst x+1 may be linearly polarised with a polarisation direction orthogonal to the polarisation of the laser beam pulses of burst x. It is also possible to cause the laser beam pulses of one or more bursts to be circularly or elliptically polarised, for example by selective application of a quarter-wave plate (not shown) in the path of the laser beam 16.

As noted above, a DOE 22 may be used to diffract the beam 16 into a predetermined pattern of output laser sub-beams, which, in conjunction with spatial filter 26, forms a desired predetermined pattern of irradiation spots on the semiconductor material. It may be advantageous to create different patterns of irradiation spots for different bursts, in other words the laser beam pulses of successive bursts are split such that the pattern of irradiation spots associated with a first burst is different to the pattern of irradiation spots associated with the next burst. This effect may be achieved in a number of ways, for example by selecting a different DOE for the second burst, or by adjusting the spatial filter 26 between bursts. In a refinement of this technique, the irradiation spots produced during successive bursts may be respectively spatially separated, to irradiate different cutting lines in the semiconductor material. In this way, a first burst could be used to produce a main cut line, while a subsequent burst could be used to create trench lines which run parallel to, but spaced from, the main cut line.

The above-described embodiments are exemplary only, and other possibilities and alternatives within the scope of the invention will be apparent to those skilled in the art. For example, while in the specific embodiments described above relative movement between the semiconductor material and the irradiating laser beam pulses is caused by moving the semiconductor material while keeping the laser optics stationary, in alternative embodiments the relative motion may be provided by keeping the semiconductor material stationary and moving the laser and/or the laser optics, or alternatively both the semiconductor material and the laser and/or laser optics may be moved.

In the specific embodiments described above, the individual laser beam pulses are created by the use of a USP laser. However, it is theoretically possible to use an external beam-chopping mechanism to create individual pulses, for example using a fast-spinning wheel with a plurality of blocking elements that are successively placed in the laser beam path.

REFERENCE NUMERALS USED

10—Laser cutting apparatus
11—Wafer
13—Chuck
14—Drive
15—USP laser source
16—Laser beam
17, 20, 24, 25, 28—Mirrors
18—Attenuator/shutter
19—Motorised half-wave plate
21—Beam expander
22—Diffractive optical element
23, 27, 29—Lens
26—Spatial filter

The invention claimed is:

1. A method of cutting a semiconductor material by irradiating the semiconductor material with laser energy, comprising the steps of:

i) providing a laser source adapted to emit successive pulses of laser beams, ii) emitting laser beam pulses from the laser source, iii) guiding the emitted laser beam pulses to irradiate semiconductor material to be cut, and iv) moving the semiconductor material relative to the irradiating laser beam pulses to cut the semiconductor material along a cutting line, wherein the laser source is adapted to emit laser beam pulses having a pulse width of 100 picoseconds or less, and in step iii), the semiconductor material is irradiated by a plurality of laser beam pulses with a pulse repetition frequency in the range from 0.5 GHz to 50 GHz, wherein the plurality of laser beam pulses are emitted in at least two successive bursts of pulses, each burst comprising a plurality of laser beam pulses, and wherein an inter-burst frequency, being a frequency of a first laser beam pulse within successive bursts, is in the range of 0.1 kHz to 1,000 kHz.

2. The method of claim 1, wherein each of the plurality of laser beam pulses has a respective pulse energy, and the method comprises a step of controlling the laser source such that a pulse energy of a first laser beam pulse within the plurality has a different pulse energy to a second laser beam pulse within the plurality.

3. The method of claim 1, wherein each burst comprises between 2 and 100,000 laser beam pulses.

4. The method of claim 3, wherein each burst comprises between 2 and 1000 laser beam pulses.

5. The method of claim 1, wherein the inter-burst frequency is in the range of 1 kHz to 100 kHz.

6. The method of claim 1, comprising the step of controlling the laser source such that the energy transmitted in successive bursts is different.

7. The method of claim 6, wherein each of the plurality of laser beam pulses has a respective pulse energy, and the method comprises the step of controlling the laser source such that a pulse energy of a pulse within a first burst is different to a pulse energy of a pulse within a second burst.

8. The method of claim 1, comprising a step of controlling the laser source such that successive bursts have different pulse repetition frequencies.

9. The method of claim 1, comprising a step of controlling the polarisation of the emitted laser beam pulses, such that the laser beam pulses of different bursts have different laser beam polarisation states.

10. The method of claim 1, wherein step iii) comprises splitting the laser beam pulses into a plurality of spatially separated sub-beams to produce a pattern of irradiation spots on the semiconductor material, and wherein the laser beam pulses of successive bursts are split such that the pattern of irradiation spots associated with a first burst is different to the pattern of irradiation spots associated with the next burst.

11. The method of claim 10, wherein the irradiation spots produced during successive bursts are respectively spatially separated, to irradiate different cutting lines in the semiconductor material.

12. Laser cutting apparatus for performing the method of claim 1.

13. A laser cutting apparatus for cutting a semiconductor material, comprising:
- a laser source adapted to emit successive pulses of laser beams, each laser beam pulse having a pulse width of 100 picoseconds or less, the laser beam pulses having a pulse repetition frequency in the range from 0.5 GHz to 50 GHz, the pulses of laser beams being emitted in at least two successive bursts of pulses, each burst comprising a plurality of laser beam pulses, wherein an inter-burst frequency, being a frequency of a first laser beam pulse within successive bursts, is in a range of 0.1 kHz to 1,000 kHz; and
- a laser beam guiding assembly for directing the laser beam pulses from the laser source to irradiate a semiconductor material to be cut, and a driving assembly for relatively moving the semiconductor material and the irradiating laser beam pulses.

* * * * *